US006380836B2

(12) United States Patent
Matsumoto et al.

(10) Patent No.: US 6,380,836 B2
(45) Date of Patent: Apr. 30, 2002

(54) COIL DEVICE AND SWITCHING POWER SUPPLY APPARATUS USING THE SAME

(75) Inventors: Tadahiko Matsumoto, Yokohama; Jun Nagai, Sagamihara, both of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/855,256

(22) Filed: May 15, 2001

Related U.S. Application Data

(62) Division of application No. 09/511,346, filed on Feb. 23, 2000, now Pat. No. 6,281,779.

(30) Foreign Application Priority Data

Mar. 11, 1999 (JP) .............................................. 11-64905

(51) Int. Cl.$^7$ ................................................ H01F 5/00
(52) U.S. Cl. ........................ 336/200; 336/232; 336/223; 336/83
(58) Field of Search ................................. 336/200, 223, 336/232, 83, 183, 192, 84 R; 29/605, 25

(56) References Cited

U.S. PATENT DOCUMENTS

| | | | | |
|---|---|---|---|---|
| 4,873,757 A | * | 10/1989 | Williams | 29/602.1 |
| 5,301,095 A | * | 4/1994 | Teramoto et al. | 363/21 |
| 5,600,293 A | * | 2/1997 | Hunter | 336/182 |
| 5,781,093 A | * | 7/1998 | Grandmont et al. | 336/232 |
| 5,929,733 A | * | 7/1999 | Anzawa et al. | 336/61 |
| 6,069,548 A | * | 5/2000 | Baarman et al. | 336/65 |

* cited by examiner

Primary Examiner—Anh Mai

(74) Attorney, Agent, or Firm—Ostrolenk, Faber, Gerb & Soffen, LLP

(57) ABSTRACT

A switching power supply has a transformer for power transmission. A core is provided having an intermediate leg and at least a pair of external legs arranged at equal intervals from the intermediate leg; a first printed coil is provided on a first substrate which has an intermediate hole and a pair of external holes respectively inserted in the intermediate leg and the pair of external legs of the core, the first printed coil being wound around the intermediate hole; a second printed coil is provided on a second substrate which has an intermediate hole and a pair of external holes respectively inserted in the intermediate leg and the pair of external legs of the core, the second printed coil including a pair of external printed coils which are connected in series and are respectively wound around the pair of the external holes and each having the same number of turns but wound in opposite directions. The pair of external printed coils of the second printed coil generate magnetic fields in opposite directions to each other in the intermediate leg such that the magnetic fields in the intermediate leg cancel each other and induce no induction voltage in the first printed coil, and induction voltages induced in the external printed coils of the second printed coil by magnetic flux generated by the first printed coil are substantially canceled, whereby the first printed coil and the second printed coil form separate inductors which are not magnetically coupled. A third printed coil is provided on a third substrate which has an intermediate hole and a pair of external holes respectively inserted in the intermediate leg and the pair of external legs of the core, the third printed coil being wound around the intermediate hole, whereby the first printed coil is magnetically coupled with the third printed coil to form a first transformer; and further wherein the tranformer for power transmission comprises the first transformer.

18 Claims, 6 Drawing Sheets

COIL DEVICE AND SWITCHING POWER SUPPLY APPARATUS USING THE SAME

CROSS REFERENCE TO RELATED APPLICATIONS

This is a divisional of U.S. patent application Ser. No. 09/511,346, filed Feb. 23, 2000, now U.S. Pat. No. 6,281,779, in the name of Tadahiko Matsumoto, et al. and entitled Coil Device and Switching Power Supply Apparatus Using the Same.

BACKGROUND OF THE INVENTION

1. Field of the Invention

The present invention relates to a coil device such as a transformer and an inductor to be used for electronic equipment, switching power supply apparatus or the like, and the switching power supply apparatus using it.

2. Description of the Related Art

Switching power supply apparatus have been widely used for a power supply units of various electronic devices such as personal computers, facsimile machines or the like. Especially, switching power supply apparatus including an isolated forward converter type as a DC—DC converter are suitably employed in laptop computers or the like.

Such a switching power supply apparatus including an isolated forward converter generally comprises a power transformer, a driving transformer and a choke coil. These coil elements use coils and core parts, which are bulky and require substantial spaces to be mounted on a circuit board. As a result, it is very difficult to miniaturize the circuit board and switching power supply apparatus itself.

In addition, transformers and choke coils are relatively expensive elements due to the fact that manufacturing methods of these elements include a step which cannot be automatically processed. It is difficult to reduce the cost of the switching power supply apparatus, accordingly.

SUMMARY OF THE INVENTION

The present invention can solve the aforementioned drawbacks associated with the conventional coil elements and provides a coil device capable of saving space, miniaturizing size, and reducing cost. The present invention also provides a switching power supply apparatus which uses the coil device and can be produced at a low cost.

The coil device comprises a core, first printed coil and a second printed coil. The core has an intermediate leg and at least a pair of external legs arranged with equal intervals from the intermediate leg. The first printed coil is provided on a first substrate which has an intermediate hole and a pair of external holes respectively inserted in the intermediate leg and the pair of external legs of the core, the first printed coil being wound around the intermediate hole. The second printed coil is provided on a second substrate which has an intermediate hole and a pair of external holes respectively inserted in the intermediate leg and the pair of external legs of the core, the second printed coil including a pair of external printed coils which are connected in series and are respectively wound around the pair of the external holes by the same number of turns but in the opposite directions.

According to this structure, the pair of external printed coils of the second printed coil generate magnetic fields in the opposite direction to each other in the intermediate leg such that the magnetic fields are canceled with each other and induce no induction voltage in the first printed coil, and induction voltages induced in the external printed coils of the second printed coil by the magnetic flux generated by the first printed coil is canceled to be equivalently 0V, whereby the first printed coil and the second printed coil form separate inductors which are not magnetically coupled.

In this invention, the number of total legs of the core includes three for a pair of external legs to one intermediate legs, four in the case of a pair of external legs and one external leg, or five in the case of two pairs of external legs.

First, a case where the number of total legs of the above-described core is three, is described. The case where the number of total legs is three is of the structure where a pair of external legs are arranged with equal intervals with the intermediate leg as the base point. Thus, a conventional E-shaped core in which the external legs are arranged in the direction opposite to each other by 180° with the intermediate leg as the center is included in this case of three legs.

Among a pair of external legs, one external printed coil wound around the one external leg and the other external printed coil wound around the other external leg are wound in the same direction and inversely connected in series, or wound in the reverse direction and forwardly connected in series to form one second printed coil (a pair of external printed coils).

Thus, when current flows in the first printed coil (intermediate printed coil) wound around the intermediate leg, magnetic fluxes parallel in the same direction passing through the one external leg and the other external leg are generated. The voltages induced in the one external printed coil and the other printed coil to be interlinked with the magnetic fluxes are in the opposite direction to each other, and canceled, and no equivalently induced voltages are outputted in both terminals of the second printed coil (a pair of external printed coils).

When current flows in the second printed coil (a pair of external printed coils), the magnetic fluxes which are generated from the one external printed coil and the other external printed coil and pass through the intermediate leg are in the opposite direction to each other, and cancel each other, and no induced voltage is outputted in both terminals of the first printed coil (intermediate printed coil).

Thus, the first printed coil (intermediate printed coil) wound around the intermediate leg and the second printed coil (a pair of external printed coils) wound around a pair of external legs constitute coil devices which are individual parts wound by cores as if they are independent from each other where the core is commonly used, and the interlinked magnetic fluxes or the induced voltages cancel with each other.

Second, a case where the number of total legs of the above-described core is four is described. In the case of four legs, which is a case where one leg (the fourth leg) is added to the above-described case with three legs, and the fourth leg is arranged on a line to perpendicularly divide into two the line connecting the external legs of a pair of external legs to each other. Thus, the fourth leg is in a relationship similar to that of the above-described intermediate leg in the form relative to a pair of external legs, and at the same time, similar to that of the above-described intermediate leg, in effect, so to speak, the second intermediate leg. Further, the fourth leg forms the relationship of a U-shaped core in relation to the intermediate leg, and the printed coils wound therearound forms the relationship between the primary coil and the secondary coil. The external printed coil wound around the fourth leg is paired with the intermediate printed coil wound around the intermediate leg, that is, a similar relationship to that of a pair of above-described external printed coils can be formed by connecting the printed coils in series so that the directions of the magnetic fluxes passing through the legs become opposite to each other. Two pairs of external printed coils can be formed thereby. In addition, two transformers can be formed by forming two pairs of external printed coils equivalent or similar to each other.

Third, a case where the number of total legs of the above-described core is five is described. In the case of five legs, which is a case where two sets of a pair of external legs, i.e., two pairs of external legs are provided, and the effect of two pairs of external printed coils (two second printed coils) wound around two sets of the external legs to the intermediate leg is the same as the relationship between the above-described intermediate leg and a pair of the external printed coils (one second printed coil). Further, the relationship between two sets of the external printed coils, i.e., between a pair of one external printed coils and a pair of the other printed coils is that the mutually induced voltages equivalently cancel each other.

Further, a case where the number of total legs is six or more is possible, and the description for the above-described cases of three to five legs is analogously applicable.

According to another embodiment of the invention, the coil device is further provided with a third printed coil equal to or similar to the above-described first printed coil, wherein the above-described first printed coil is magnetically coupled with the above-described third printed coil to form the first transformer.

In this embodiment, the third printed coil (intermediate printed coil) wound around the intermediate leg around which the first printed coil is already wound is magnetically coupled with the above-described first printed coil to constitute the first transformer (intermediate transformer) in the relationship between the primary coil or the secondary coil of the transformer. The magnetic flux generated from the third printed coil of the first transformer is induced in the second printed coil to generate the voltage, but the voltage is canceled to be 0V. The magnetic flux generated from the second coil and passing through the intermediate leg is canceled, and no voltage due to the induction is generated in the third printed coil of the first transformer.

According to still another embodiment, the coil device is further provided with a fourth printed coil equal to or similar to the above-described second printed coil, wherein the above-described second printed coil is magnetically coupled with the above-described fourth printed coil to form the second transformer.

In this embodiment, the fourth printed coil (a pair of external printed coils) further wound around a pair of external legs around which the second printed coil is already wound is magnetically coupled with the above-described second printed coil to constitute the second transformer (external transformer). The magnetic flux generated from each printed coil of the fourth printed coil of the second transformer and passing through the intermediate leg is canceled, and no voltage due to the induction is generated in the first printed coil (intermediate printed coil). The magnetic flux generated from the first printed coil is interlinked with the fourth printed coil of the second transformer to generate the voltage, but this voltage is canceled to be 0V.

According to still another embodiment, a coil device is provided with a third printed coil equal to or similar to the above-described first printed coil wherein the above-described first printed coil is magnetically coupled with the above-described third printed coil to form a first transformer, and is further provided with a fourth printed coil equal to or similar to the above-described second printed coil wherein the above-described second printed coil is magnetically coupled with the above-described fourth printed coil to form the second transformer.

In this embodiment, the first transformer (intermediate transformer) having two intermediate printed coils around the intermediate leg of the core is formed, and the second transformer (external transformer) having two pairs of the external printed coils around a pair of external legs is formed. A pair of the intermediate printed coils of the first transformer and a pair of the external printed coils of the second transformer are wound around one core, but similar to the effect of the invention already described, the interlinked magnetic fluxes cancel each other, or the voltages due to the induction cancel each other to form two independent transformers jointly using one core.

According to still another embodiment, a switching power supply apparatus includes a transformer for power transmission having a primary coil and a secondary coil, a main switch to control the current flowing from the input power supply into the primary coil, a rectifying and smoothing circuit which includes a choke coil and rectifies and smoothes the output of the secondary coil of the transformer for power transmission, and a control circuit to control the action of the main switch, the transformer for power transmission and the choke coil being formed of the coil device described above.

In this embodiment, the transformer for power transmission and the choke coil for rectifying and smoothing operation sharing the core comprise the coil device provided with the transformer which is formed on one core and equivalently generates no output voltage due to the induction. A core fitting space to a circuit substrate of the switching power supply apparatus is reduced thereby. Further, in the choke-input type rectifying and smoothing circuit, the secondary winding of the transformer for power transmission and the choke coil can be wired as one coil device in the manufacturing stage.

Alternatively, in the switching power supply apparatus including a transformer for power transmission having a primary coil and a secondary coil, a main switch to control the current flowing from an input power supply into the primary coil, a rectifying and smoothing circuit which includes a choke coil and rectifies and smoothes the output of the secondary coil of the transformer for power transmission and a current transformer to detect the current flowing in the main switch and to output it to the above-described control circuit, the transformer for power transmission and the current transformer can comprise the coil device described above.

In this case, two transformers which are formed into one core and constitute a coil device generate no voltage due to the mutual induction between the windings of the two transformers, and are operated as independently individual parts. Thus, a transformer to be used for both power and the control system can have a common core.

Further, in the switching power supply apparatus including a transformer for power transmission having a primary coil and a secondary coil, a main switch to control the current flowing from an input power supply into a primary coil, a rectifying and smoothing circuit having a rectifier which includes a choke coil and rectifies and smoothes the output of the secondary coil of the transformer for power transmission, a control circuit to control the action of the main switch, a drive transformer to transmit the drive signal from a control circuit and drive a high-side switch, and a synchronous commutator the transformer for power transmission and the drive transformer can comprise the coil device described above.

In this case, two transformers which are formed in one core and comprising a coil device generate no voltage due to the mutual induction between the windings of the two transformers, and are operated as independently individual parts. Thus, a transformer to be used both for power and the control system can have a common core.

According to the present invention, since two independent inductors (or coils), a transformer and an inductor, or two independent transformers can be formed in a single coil device using a single core, space can be saved, and the cost can be reduced compared with a case where a plurality of cores for individual inductors are used.

When the number of the total legs of the core is three, cores of the EE-shape, EI-shape, pot-shape or the like which have been extensively used can be used as they are, and the cost for new design of the core can be reduced.

Also, when the coil device wound by a conventional winding is switched to the coil device of the present invention, no bobbin is required, and the cost for the new design can be reduced by using a printed coil printed on a printed circuit board.

Further, by using the coil device of the present invention, it is possible to reduce the space necessary for transformers and coils, minimize the size of the circuit board of a switching power supply apparatus and reduce the mounting cost.

For the purpose of illustrating the invention, there is shown in the drawings several forms which are presently preferred, it being understood, however, that the invention is not limited to the precise arrangements and instrumentalities shown.

BRIEF DESCRIPTION OF THE DRAWING(S)

FIG. 1 is a view of a printed coil substrate of each layer.

DETAILED DESCRIPTION OF EMBODIMENTS OF THE INVENTION

Hereinafter, the preferred embodiments of the present invention are explained in detail with reference to the drawings.

An embodiment of a coil device of the present invention is described below referring to FIG. 1A and FIG. 1B for a case where two inductor (coils) which can be regarded to be independently individual parts from each other are combined with one core.

Figure 1A:
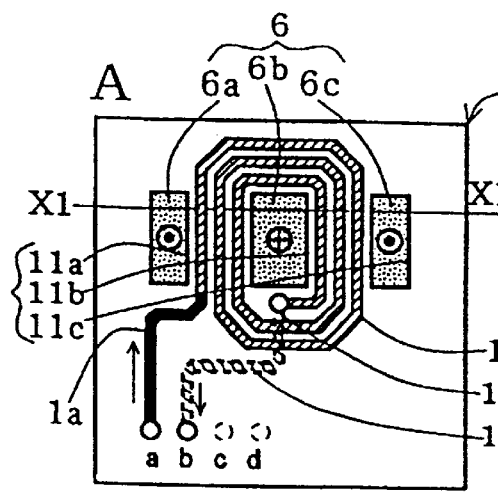
FIG. 1A is a plan view illustrating a first printed coil substrate.

In FIG. 1A, reference numeral 11 denotes a first printed coil substrate, and three rectangular through holes 11a–11c are formed in its center part in a line at appropriate intervals. A first printed coil 1 (a first intermediate printed coil) of three turns is formed in a winding manner clockwise from the outer side to the inner side on a surface of a first printed coil substrate 11 around the center through hole 11b among these three through holes 11a–11c. An external terminal of the first printed coil 1 is connected to an external terminal a through a connection wiring 1a. An internal terminal of the first printed coil 1 is connected to an external terminal b through a connection wiring 1c formed on a via hole 1b and its back surface. The first printed coil substrate 11, on which the first printed coil 1 is formed, is mounted by respectively inserting and fitting three through holes 11a–11c into an external leg 6a, an intermediate leg 6b and an external leg 6c of an E-shaped core 6.

Figure 1B:
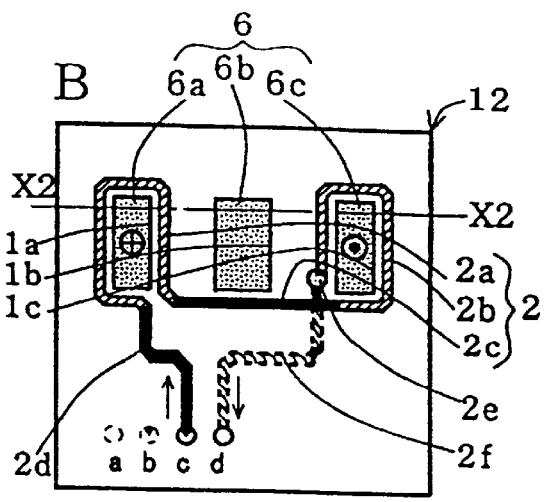
FIG. 1B is a plan view illustrating a second printed coil substrate.

In FIG. 1B, reference numeral 12 denotes a second printed coil substrate, and one external printed coil 2a of one turn and the other external printed coil 2b are formed on a surface of the second printed coil substrate 12 around the external through holes 11a and 11c among these three through holes 11a–11c. The one external printed coil 2a and the other external printed coil 2b are inversely connected to one terminal of the one external printed coil 2a and one terminal of the other external printed coil 2b by a connection wiring 2c so that the one external printed coil 2a and the other external printed coil 2b are wound in a direction opposite to each other, and a second printed coil 2 (a pair of external printed coils) is formed.

Figure 2:
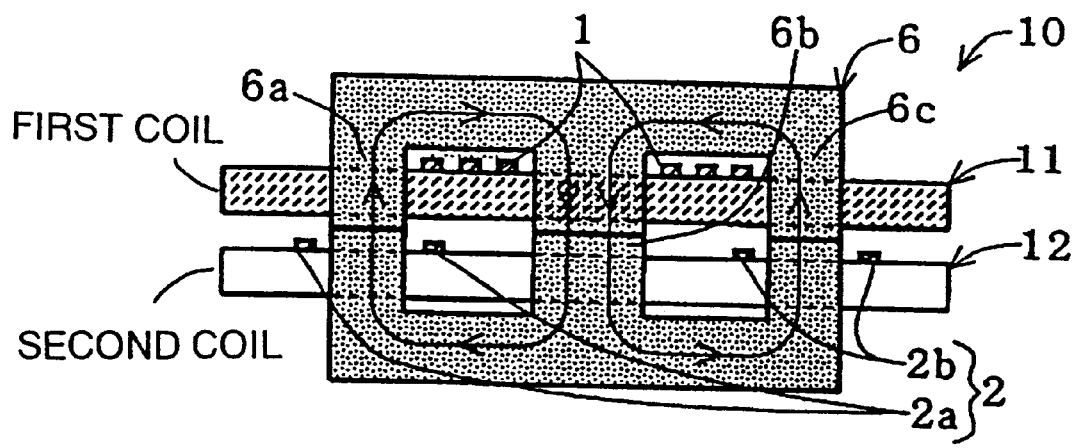
FIG. 2 is a sectional view of a coil device to indicate the direction of the magnetic flux by the first printed coil by fitting the first printed coil substrate and the second printed coil substrate to an EE-shaped core.

For example, the external printed coil 2a is wound clockwise while the external printed coil 2b is wound counter clockwise as shown in FIG. 1B. The other terminal of the one external printed coil 2a is connected to an external terminal c through a connection wiring 2d. The other terminal of the other external printed coil 2b is connected to an external terminal d through a connection wiring 2f formed on a via hole 2e and its back side. The second printed coil substrate 12 on which the second printed coil 2 is formed is mounted by respectively inserting and fitting these three holes 11a–11c into the external leg 6a, the intermediate leg 6b, and the external leg 6c of the E-shaped coil as illustrated in FIG. 2. In this condition, an electrical insulation body, for example, an insulation substrate of the same material as that of the printed coil substrate is interposed between the first printed coil substrate 11 and the second printed coil substrate 12.

In FIG. 1A, when the current flows in the direction of the external terminal a to b in the first printed coil 1 formed on the first printed coil substrate 11, the magnetic flux generated from the first printed coil 1 passes through the intermediate leg 6b of the EE-shaped core 6 as illustrated by an arrow in a fine line as illustrated in FIG. 2 to form a parallel magnetic path passing through one external leg 6a and the other external leg 6c. Since the magnetic flux interlinked with the one external printed coil 2a is equal to that interlinked with the other external printed coil 2b, the voltage induced in the one external printed coil 2a is equal to that induced in the other external printed coil 2b. Since the one external printed coil 2a is inversely connected to the other external printed coil 2b by the connection wiring 2c as described above, these added voltages cancel each other and the output voltages across the external terminals c, d is zero.

Figure 3:
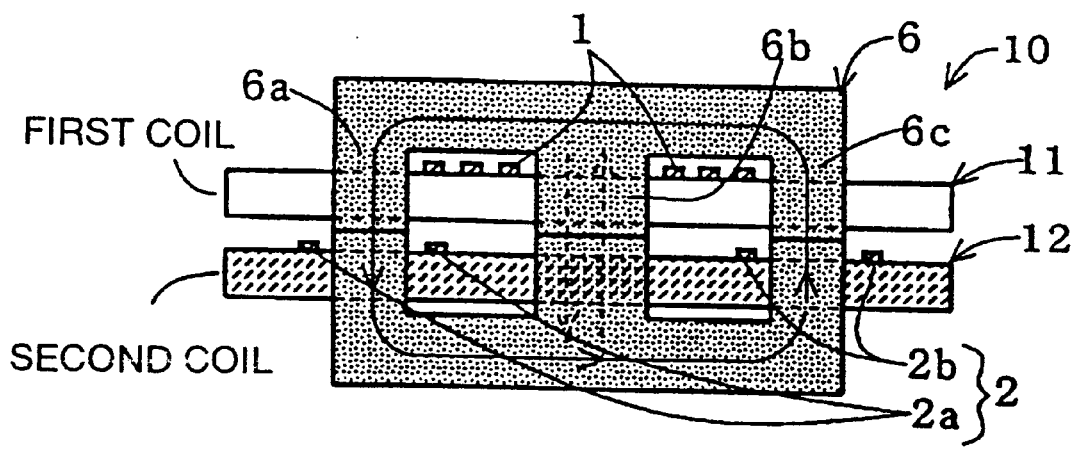
FIG. 3 is a sectional view of a coil device to indicate the direction of the magnetic flux by the second printed coil by fitting the first printed coil substrate and the second printed coil substrate to the EE-shaped core.

In FIG. 1B, when the current flows in the direction of the external terminals c to d in the second printed coil 2, magnetic fluxes in the opposite direction to each other are generated on the one external printed coil 2a and the other external printed coil 2b constituting the second printed coil 2 as illustrated in FIG. 3 by the fine line arrow, and these magnetic fluxes intensify each other in the external legs 6a and 6c of the EE-shaped core 6 while the magnetic fluxes cancel each other in the intermediate leg 6b as illustrated by the broken line arrow. Thus, no induced voltage is generated in the first printed coil 1 (a first intermediate printed coil) wound around the intermediate leg 6b by the magnetic flux generated from the second printed coil 2, and no voltage is generated across the external terminals a, b.

Thus, the first printed coil 1 and the second printed coil 2 are combined by commonly using one core through the winding mode of these coils, and since no voltage is generated in these external terminals by canceling the magnetic flux from the counter coil or by canceling the induced voltage, these coil can be regarded as independently individual parts as if they are formed on separate cores, and the first printed coil 1 and the second printed coil 2 can form individual self-inductances, respectively.

Figure 1C:
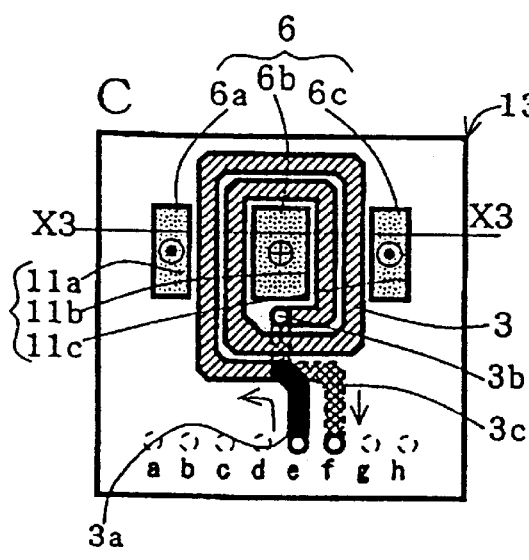
FIG. 1C is a plan view illustrating a third printed coil substrate.

An embodiment of the coil device of the present invention is described referring to FIG. 1C in a case where one transformer and one inductor which can be regarded to be individual parts from each other are formed on one core.

In this figure, 13 denotes a third printed coil substrate, and the substrate has three through holes 11a–11c similar to the first printed coil substrate 11 and the second printed coil substrate 12. A third printed coil 3 (a second intermediate printed coil) of two turns is formed on a surface of the third printed coil substrate 13 around the center through hole 11b in a winding manner clockwise from the outer side to the inner side. An external terminal of the third printed coil 3 is connected to an external terminal e through a connection wiring 3a. An internal terminal of the third printed coil 3 is connected to an external terminal f through a via hole 3b and a connection wiring 3c formed on its back side. The third printed coil substrate 13 on which the third printed coil 3 is formed is mounted by inserting and fitting these three through holes 11a–11c into the external leg 6a, the intermediate leg 6b, and the external leg 6c of the EE-shaped core 6. In this condition, an electric insulation body is interposed between substrates in a similar manner to the above-described case.

Figure 4:
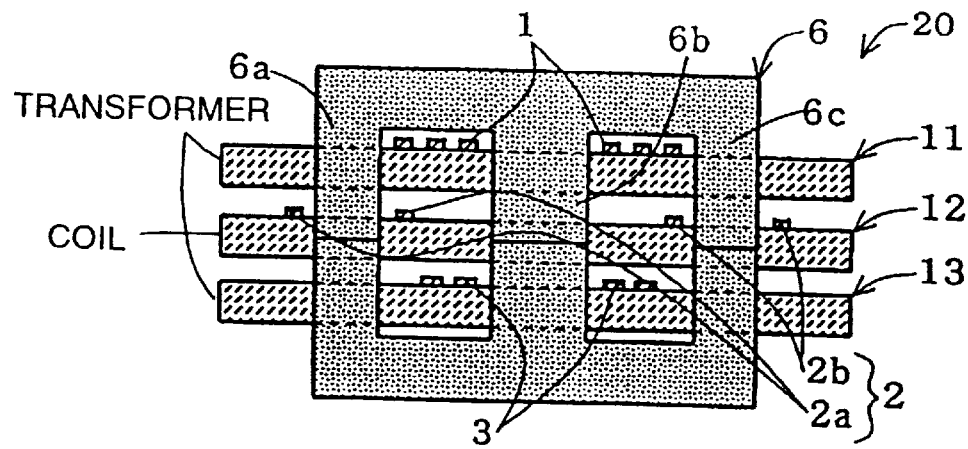
FIG. 4 is a sectional view of a coil device in which the first printed coil substrate, the second printed coil substrate and the third printed coil substrate are fitted to the EE-shaped core.

In FIG. 4, the first printed coil 1 formed on the first printed coil substrate 11 and the third printed coil 3 formed on the third printed coil substrate 13 are wound around the intermediate leg 6b of the core 6 to form a first transformer through the mutual magnetic coupling. In FIG. 1C, when the current flows in the direction of the external terminals e to f in the third printed coil 3, the magnetic flux in the direction indicated by the fine line arrow in FIG. 2 is generated. The direction of generating the magnetic flux is similar to that in the case of the first printed coil 1 illustrated in FIG. 1A.

Thus, the interaction between the third printed coil 3 and the second printed coil 2 is similar to the interaction between the first printed coil 1 and the second printed coil 2 as described above. That is, the magnetic flux generated from the third printed coil 3 of the first transformer is interlinked with the respective external printed coils 2a and 2b of the second printed coil 2, but the voltages to be outputted to the external terminals c and d are 0V since the respective external printed coil 2a and 2b are inversely connected to each other. The magnetic flux generated from the second printed coil 2 (a pair of external printed coils 2a and 2b) and passing through the intermediate leg 6b becomes the inverse magnetic flux due to the inverse connection as described above, and cancels, and no voltage due to the induction is generated in the third printed coil 3 of the first transformer.

Figure 1D:
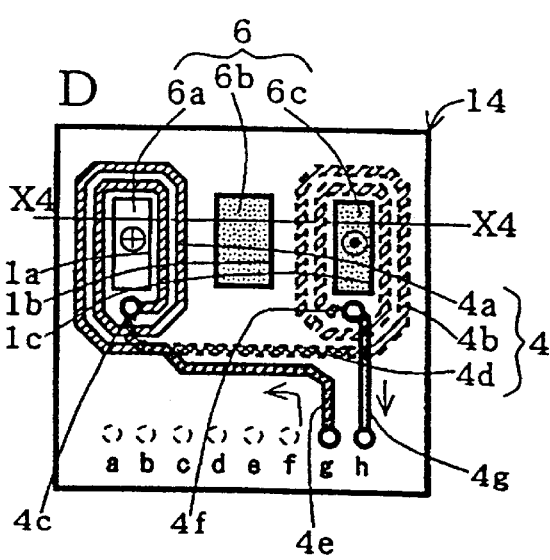
FIG. 1D is a plan view of a fourth printed coil substrate.

Next, an embodiment of the coil device of the present invention is described referring to FIG. 1D in a case where two transformers which can be regarded to be individual parts are formed on one core.

Figure 5:
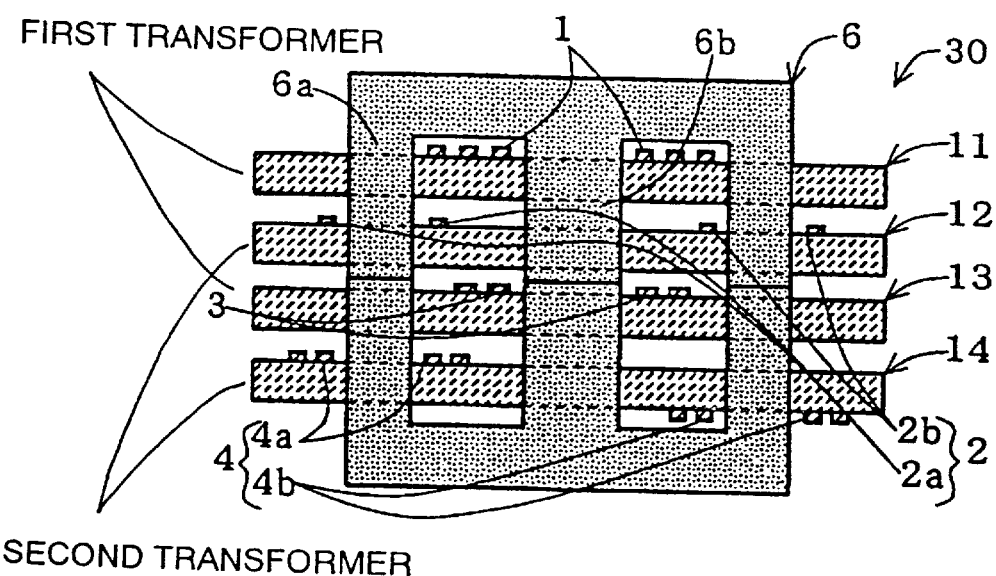
FIG. 5 is a sectional view of a coil device in which the first printed coil substrate, the second printed coil substrate, the third printed coil substrate and the fourth printed coil substrate are fitted to the EE-shaped core.

In FIG. 1D, 14 denotes a fourth printed coil substrate, which has three through holes 11a–11c in a similar manner to the first printed coil substrate 11 to the third printed coil substrate 13. One external printed coil 4a of two turns is formed on a surface of a fourth printed coil substrate 14 around one outer through hole 11a among these three through holes 11a–11c in a winding manner clockwise from the outer side to the inner side. The other external printed coil 4b of two turns is similarly formed on a back side of the fourth printed coil substrate 14 around another outer through hole 11c in a winding manner counterclockwise from the outer side to the inner side viewed from the face side. An internal terminal of the one external printed coil 4a is connected to an external terminal of the other external printed coil 4b through a via hole 4c and a connection wiring 4d formed on a back side. An external terminal of the one external printed coil 4a is connected to an external terminal g through a connection wiring 4e. An internal terminal of the other external printed coil 4b is connected to an external terminal h through a via hole 4f and a connection wiring 4g. The one external printed coil 4a and the other external printed coil 4b comprise the fourth printed coil 4. The fourth printed coil substrate 14 on which the fourth printed coil 4 is formed is mounted by respectively inserting and fitting these three through holes 11a–11c into the external leg 6a, the intermediate leg 6b and the external leg 6c of the EE-shaped core 6 as illustrated in FIG. 5. In this condition, an electric insulation body is interposed between substrates similar to the case described above.

As illustrated in FIG. 1D, when the current flows in the direction of the external terminals g to h, the direction of the magnetic flux passing through the one external leg 6a is opposite to that of the magnetic flux passing through the other external leg 6c. The direction of the magnetic flux is the same as the direction of the magnetic flux formed by the one external printed coil 2a and the other external printed coil 2b illustrated in FIG. 1B by the plus symbol and the dots, and the direction of the magnetic flux indicated in FIG. 3 by the fine line arrow.

In FIG. 5, the first printed coil 1 formed on the first printed coil substrate 11 and the third printed coil 3 formed on the third printed coil substrate 13 are wound around the intermediate leg 6b of the core 6, and magnetically coupled with each other to form a first transformer. Further, the second printed coil 2 formed on the second printed coil substrate 12 and the fourth printed coil 4 formed on the fourth printed coil substrate 14 are wound around the one external leg 6a and the other external leg 6c of the core 6, and magnetically coupled with each other to form a second transformer. Windings (the first printed coil 1 and the third printed coil 3) of this first transformer and windings (the second printed coil 2 and the fourth printed coil 4) of the second transformer can be handled as independent parts formed on separate cores since their magnetic fluxes cancel each other, the induced voltages are cancel each other, and no equivalent voltage is generated therebetween though they are combined with each other into one magnetic core 6.

Figure 6:
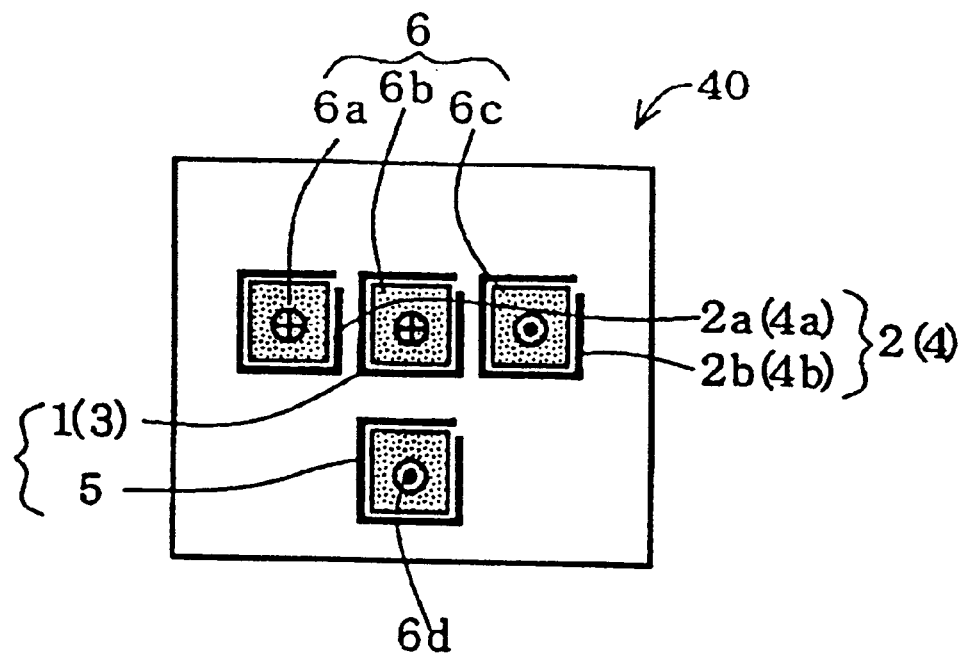
FIG. 6 is a plan view of the coil device having four legs.

The above-described embodiments are described in a case where coil parts which can be regarded to be independent from each other, for example, an inductor and an inductor, an inductor and a transformer, and a transformer and a transformer are formed on the magnetic core using one E-shaped magnetic core having three legs, but these two coil parts which can be regarded to be independent from each other can be similarly realized by a coil device 40 having a fourth leg 6d illustrated in FIG. 6, and at the same time, can be used in a different manner. The fourth leg 6d is arranged on a line orthogonal to the line connecting a pair of external legs 6a and 6c to each other, and located at the position at the uniform distance from a pair of external legs 6a and 6c. Thus, by arranging the fourth leg 6d, the voltage induced by the magnetic flux formed by the fifth printed coil 5a wound around the fourth leg 6d can be canceled on the second printed coil 2.

In the above-described embodiments, the one external printed coil 2a (4a) and the other external printed coil 2b (4b) are paired and used for a pair of the external printed coils (the second printed coil 2 and the fourth printed coil 4), and similarly, the first printed coil 1 (the intermediate printed coil) and the fifth printed coil 5 are paired and used for a pair of printed coils.

In another use from the above-described one, the first printed coil 1 and the fifth printed coil 5 can be used in a relationship such that one is a primary coil and the other a secondary coil.

A plurality of coil parts which can be regarded to be individual ones can be combined through the common use of one magnetic core since the legs 6a–6d of the magnetic core are of a geometrically uniform arrangement and structure, and the magnetic fluxes formed by the printed coil wound therearound cancel each other, or the induced voltages cancel each other.

Figure 7:
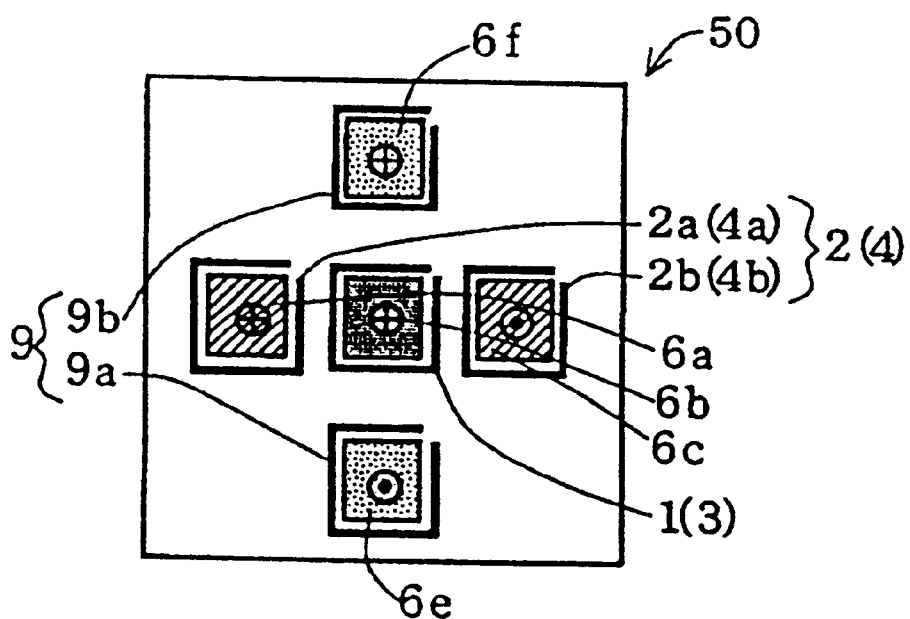
FIG. 7 is a plan view of the coil device having five legs.

Next, a case where the total number of legs of the above-described core is five is described referring to FIG. 7. The embodiment illustrated in FIG. 7 has external legs 6e and 6f arranged at equal intervals along a line orthogonal to the above-described line around the intermediate leg 6b relative to the external legs 6a and 6c arranged on the line with equal intervals around the intermediate leg 6b. A pair of external printed coils 9a and 9b formed on a printed coil substrate not indicated in the figure are arranged around these external legs 6e and 6f. A pair of these external printed coils 9a and 9b are paired as described above, and connected in series to each other to constitute the sixth printed coil 9.

In the present embodiment, the first transformer comprises the first printed coil 1 and the third printed coil 3, the second transformer comprises the second printed coil 2 and the fourth printed coil 4, and one inductor comprises the sixth printed coil 9 (a pair of external printed coils 9a and 9b). Thus, three coil parts, that is, two transformers and one inductor are formed one core.

A third transformer can be formed through the magnetic coupling with the already wound sixth printed coil 9 by further forming a seventh printed coil equivalent to or similar to the sixth printed coil 9 on the external legs 6e and 6f. That means, three transformers which can be regarded to be independent from each other can be constituted in one core. In the present embodiment, two transformers and one inductor, one transformer and two inductors, and three inductors can be constituted in addition to three transformers in the present embodiment. When a space can be ensured around a center through hole 11b, another printed coil together with the first printed coil can be wound.

Figure 8:
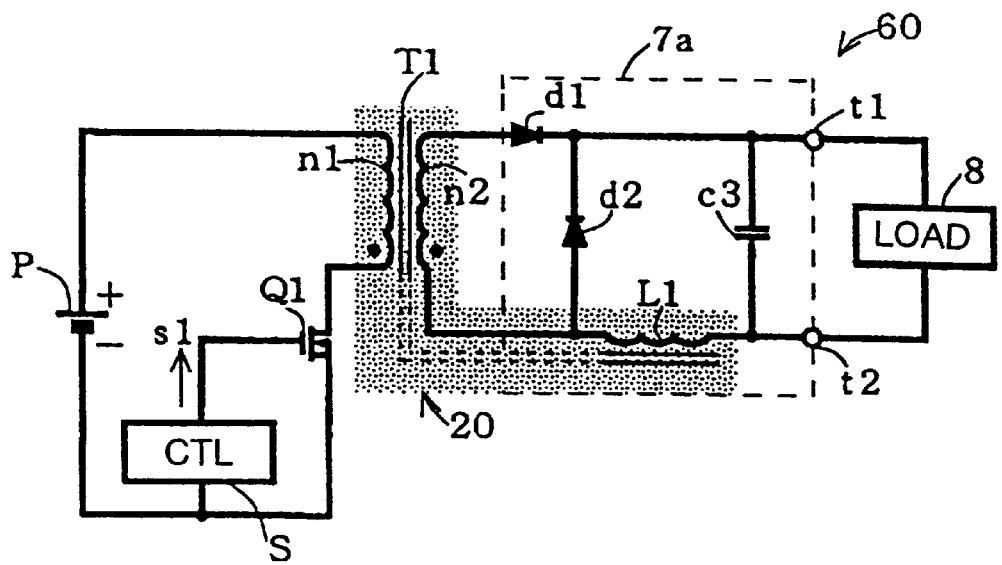
FIG. 8 is a circuit diagram of a switching power supply apparatus provided with the coil device illustrated in FIG. 4.

A switching power supply apparatus 60 using a coil device 20 in which one transformer and one coil (inductor) illustrated in FIG. 4 are formed using one core is described referring to FIG. 8. The switching power supply apparatus 60 illustrated in FIG. 8 comprises an isolation type forward converter circuit providing DC—DC conversion, and an accessory circuit is omitted.

A terminating terminal of a primary winding n1 of a transformer T1 for power transmission is connected to a positive terminal (+) of an input power supply P, and its starting terminal is connected to a drain of a transistor Q1 which is a switching element (a main switch), and its source is connected to a negative terminal (−) of the input power supply P. A gate of the transistor Q1 is connected to the negative terminal of the input power supply P through a control circuit S to control the conducting pulse width of the transistor Q1.

A rectifying and smoothing circuit 7a is connected to a secondary winding n2 side of the transformer T1 for power transmission, and the conversion power is supplied from its output terminals t1 and t2 to a load 8. The rectifying and smoothing circuit 7a comprises, similar to a conventional rectifying and smoothing circuit, a rectifying diode d1, a commutating diode d2, a choke coil L1, a smoothing capacitor c3, and its output terminals t1 and t2. The coil device 20 formed in the same core illustrated in FIG. 4 are used for the transformer T1 for power transmission and the choke coil L1. A starting terminal and a terminating terminal of the secondary wining n2 are connected to an anode of rectifying diode d1 and an anode of commutating diode d2, respectively. Cathodes of the rectifying diode d1 and the commutating diode d2 are connected to the output terminal t1. The choke coil L1 is connected across the anode of the commutating diode d2 and the output terminal t2. The smoothing capacitor c3 is connected between the output terminals t1 and t2.

The operation of the switching power supply apparatus 60 is described below. When the transistor Q1 is turned on by the switching control signal from the control circuit S, the current to be supplied from the input power supply P flows in the primary winding n1 of the transformer T1 to induce the voltage in the secondary winding n2. The induced voltage is rectified by the rectifying diode d1, and smoothed by the choke coil L1 and the capacitor c3 to supply power to the load 8. When the transistor Q1 is turned off by the control signal from the control circuit S, the induced voltage is inverted, and though the induced reverse voltage in the secondary winding n2 is impeded by the rectifying diode d1, the reverse voltage which is the electromagnetic energy accumulated in the choke coil L1 is rectified by the commutating diode d2, and the power is supplied to the load 8 while charging the capacitor c3. When the transistor Q1 conducts, the condition is returned to the original one to continue the DC—DC conversion. This is the basic action of the switching power supply apparatus 60.

The action to stabilize the output voltage of a switching power supply apparatus 60 is now described. Though not illustrated in the figure, an output voltage detection and error amplification circuit (hereinafter, referred to as "detection circuit") to detect the fluctuation in the output voltage and feed it back to the control circuit S is attached between the output terminals t1 and t2. It is assumed here that the voltage between the output terminals t1 and t2 is reduced due to the fluctuation in the voltage of the load 8. Then, the reduced voltage is detected by the detection circuit, and outputted to the control circuit S. The pulse width of the switching control signal s1 is increased by the control circuit S, and outputted. The ON time of the transistor Q1 is increased, the electromagnetic energy accumulated in the secondary winding n2 of the transformer T1 is increased, and the output voltage appearing across the output terminals t1 and t2 after the rectifying and smoothing operation is also increased, and controlled back to the original steady-state condition. When the voltage between the output terminals t1 and t2 is increased, the output voltage between the output terminals t1 and t2 is reduced by narrowing the pulse width of the switching control signal s1, and thus return the output voltage to the original steady-state condition.

The switching power supply apparatus 60 illustrated in FIG. 8 can save space, miniaturize the size of the apparatus, and reduce the mounting cost by using the coil device 20 in which the transformer T1 for power transmission and the smoothing choke coil L1 are formed into one core. In the switching power supply apparatus 60, the circuit wiring and the circuit parts illustrated in FIG. 8 are formed in one laminated circuit substrate and arranged thereon. Since the coil device and also makes of the circuit parts is also constituted making use of the laminated circuit substrate, the space of the coil device in the circuit substrate can be reduced compared with that of a conventional one.

Figure 9:
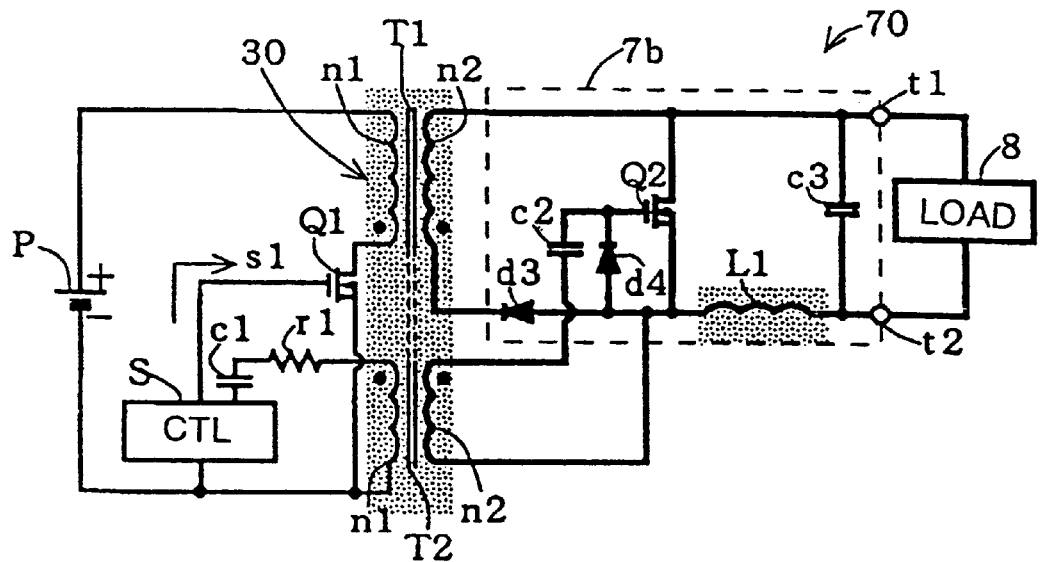
FIG. 9 is a circuit diagram of a switching power supply apparatus provided with the coil device illustrated in FIG. 5.

A switching power supply apparatus 70 using a coil device 30 in which two transformers illustrated in FIG. 5 are formed by one core is now described referring to FIG. 9.

In the switching power supply device 70, a terminating terminal of a primary winding n1 of a transformer T1 for power transmission is connected to a positive terminal (+) of a DC input power supply P, and a starting terminal is connected to a drain of a field-effect transistor Q1 which is a switching element (a main switch), and its source is connected to a negative terminal (–) of the input power supply P. A gate of this transistor Q1 is connected to one output terminal of a control circuit S one terminal of which is connected to the negative terminal of the input power supply P. The other terminal of the control circuit S is connected to the starting terminal of the primary winding n1 of a transformer T2 for drive through a series circuit of a capacitor c1 and a resistor r1, and its terminating terminal is connected to the negative terminal of the input power supply P.

A secondary winding n2 of the transformer T1 is connected to a load 8 through output terminals t1 and t2 of a rectifying and smoothing circuit 7b. This rectifying and smoothing circuit 7b is a known circuit, and mainly comprises a rectifying diode 3, a transistor Q2 for synchronous rectification, a choke coil L1, a smoothing capacitor c3 or the like, and the form of connection is as follows.

The terminating terminal n2 of the secondary winding n2 of the transformer T1 is connected to the drain of the transistor Q2 for synchronous rectification, one terminal and the output terminal t1 of the smoothing capacitor c3. The starting terminal of the secondary winding n2 of the transformer T1 is connected to a cathode of a rectifying diode d3, and its anode is connected to the output terminal t2 through the choke coil L1.

The anode of a diode d4 for bias, the terminating terminal of the secondary winding n2 of the transformer T2 for drive, and the source of the transistor Q2 for synchronous rectification are connected to a connection point of the anode of the rectifying diode d3 to the choke coil L1. The gate of the transistor Q2 for synchronous rectification is connected to a cathode of a diode d4 for bias, and also connected to the starting terminal of the secondary winding n2 of the transformer T2 for drive through a capacitor c2. The other terminal of the smoothing capacitor c3 is connected to a connection point of the choke coil L1 to the output terminal t2.

One of the unique features of the switching power supply apparatus 70 is that the transformer T1 and the transformer T2 are formed by one core. Due to this feature, the switching power supply apparatus 70 illustrated in FIG. 9 can save the space, miniaturize the size of the apparatus, and reduce the mounting cost by using the coil device 30 in which the transformer T1 for power transmission of the power system and the transformer T2 for drive of the control system are formed by one core. In the switching power supply apparatus 70, the circuit wiring and the circuit parts illustrated in FIG. 9 are formed in one laminated circuit substrate, and arranged thereon. Since the coil device which is one of the circuit parts is also constituted making use of the laminated circuit substrate, the space of the coil device in the circuit substrate can be reduced compared with that of a conventional device.

In the switching power supply apparatus 70 illustrated in FIG. 9, the coil device 30 is used for two coil devices, but a coil device 40 illustrated in FIG. 6 can also be used. The choke coil L1 illustrated in FIG. 9 can also be combined into one core by using a coil device 50 illustrated in FIG. 7.

Figure 10:
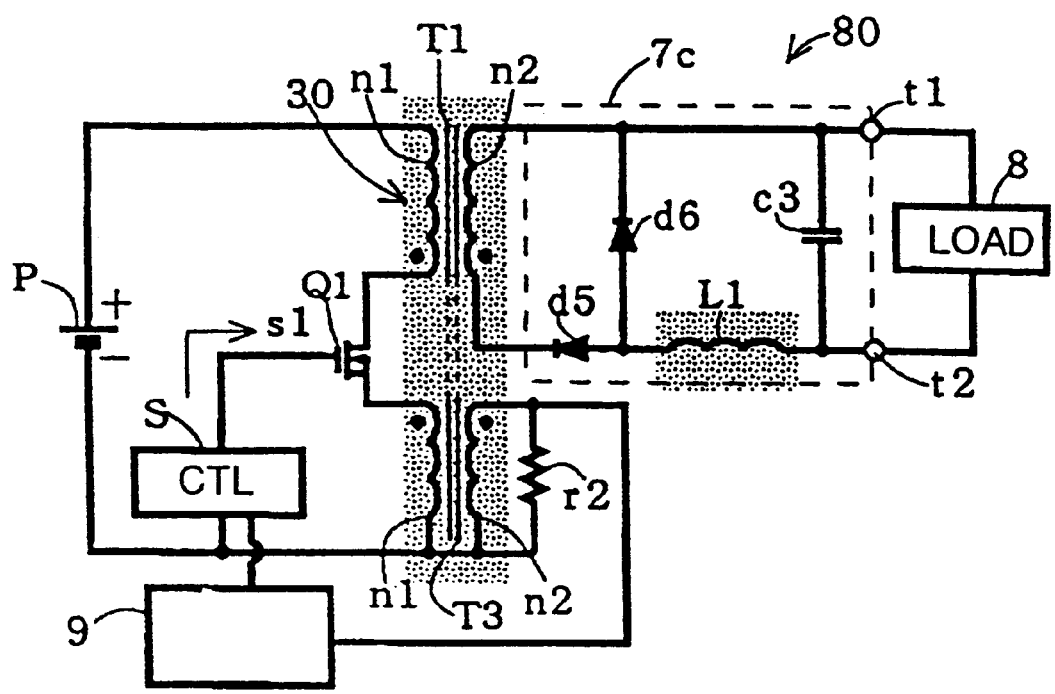
FIG. 10 is a circuit diagram of a switching power supply apparatus provided with the coil device illustrated in FIG. 5.

A switching power supply apparatus 80 using the coil device 30 in which two transformers illustrated in FIG. 5 are formed by one core is described referring to FIG. 10. The switching power supply apparatus 80 illustrated in FIG. 10 comprises an isolation type forward converter circuit providing DC—DC conversion, and an accessory circuit is omitted.

A series circuit comprising the primary winding n1 of the transformer T1 for power transmission, the field-effect transistor Q1 which is a switching element, and the primary winding n1 of a current transformer T3 is connected between the positive terminal (+) and the negative terminal (–) of the input power supply P. The coil device 30 illustrated in FIG. 5 is used for the transformer T1 for power transmission and the current transformer T3. The control circuit S is connected between the gate of the transistor Q1 and the negative terminal of the input power supply P. The function of this control circuit S is as described above. A resistor r2 is connected to both terminals of the secondary winding n2 of the current transformer T3. This current transformer T3, in which one terminal of its primary winding n1 and one terminal of the secondary winding n2 (the resistor r2) are connected to the negative terminal of the input power supply P, detects the source current of the transistor Q1, and outputs a voltage proportional to this source current between both terminals of the resistor r2. The other terminal of the resistor r2 is connected to the control circuit S through an overcurrent protection circuit 9. In this overcurrent protection circuit 9, a voltage is generated across resistor r2 by the current running in the current transformer T3, and the generated voltage is received, and compared with the preset level, and the output voltage is stabilized by controlling the conducting pulse width of the transistor Q1 through the control circuit S depending on the level.

The rectifying and smoothing circuit 7c is connected to the secondary winding n2 side of the transformer T1 for power transmission, and power is supplied to the load 8 from its output terminals t1 and t2. The rectifying and smoothing circuit 7c, similar to a conventional rectifying and smoothing circuit, comprises a rectifying diode d5, a commutating diode d6, the choke coil L1, the smoothing capacitor c3 or the like.

The action of the switching power supply apparatus 80 is described below. When the transistor Q1 is turned on by the switching control signal from the control circuit S, the current from the input power supply P in the primary winding n1 of the transformer T1. The voltage induced in the secondary winding n2 generated during the conduction of the transistor Q1 is rectified by the diode d5, and the reverse voltage in the choke coil L1 generated when the transistor Q1 is not conducting is rectified by the commutating diode d6, and accumulated in the capacitor c3, and at the same time, the power is supplied to the load 8. This is the basic action of the switching power supply apparatus 60.

The action to stabilize the output voltage of the switching power supply apparatus 80 is now described. Though not illustrated in the figure, an output voltage detection and error amplification circuit (hereinafter, referred to as "detection circuit") to detect the fluctuation in the output voltage and feed it back to the control circuit S is disposed between the output terminals t1 and t2. It is assumed here that the voltage between the output terminals t1 and t2 is reduced due to the fluctuation in the voltage of the load 8. Then, the reduced voltage is detected by the detection circuit, and outputted to the control circuit S. The pulse width of the switching control signal s1 is increased by the control circuit S, and outputted. The ON time of the transistor Q1 is increased, the electromagnetic energy accumulated in the secondary winding n2 of the transformer T1 is increased, and the output voltage appearing across the output terminals t1 and t2 after the rectifying and smoothing operation is also increased, and controlled back to the original steady-state condition. When the voltage between the output terminals t1 and t2 is increased, the output voltage between the output terminals t1 and t2 is reduced by narrowing the pulse width of the switching control signal s1, thereby controling the output voltage back to its original steady-state condition. This control method is the same as that illustrated in FIG. 9.

In addition, the switching power supply apparatus 80 illustrated in FIG. 10 detects the magnitude of the current flowing in the primary winding n1 of the transformer T1 for power transmission and the transistor Q1 by the current transformer T3 and the overcurrent protection circuit 9 for the means to stabilize the output, and narrows the conducting pulse width of the transistor Q1 through the control circuit S when the converted voltage in the resistor r2 of the current is higher than the specified level, or stabilizes the output voltage by increasing the conducting pulse width when the converted voltage is lower than the specified level.

The switching power supply apparatus 80 illustrated in FIG. 10 can save space, miniaturize size, and reduce mounting cost by using the coil device 30 in which the transformer T1 for power transmission and the current transformer T3 of the control system are formed by one core. In the switching power supply apparatus 80, the circuit wiring and the circuit parts illustrated in FIG. 10 are formed in one laminated circuit substrate and arranged thereon. Since the coil device, which is one of the circuit parts, is also constituted making use of the laminated circuit substrate, the space of the coil device in the circuit substrate can be reduced compared with that of a conventional device.

In the switching power supply apparatus 80 illustrated in FIG. 10, the coil device 30 is used for two coil devices, but the coil device 40 illustrated in FIG. 6 can also be used. The choke coil L1 illustrated in FIG. 10 can also be combined into one core by using the coil device 50 illustrated in FIG. 7.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A switching power supply apparatus comprising a transformer for power transmission having a primary coil and a secondary coil, a main switch to control the current flowing from an input power supply into the primary coil, a rectifying and smoothing circuit which includes a choke coil and rectifies and smoothes an output of the secondary coil of the transformer for power transmission, and a control circuit to control the action of the main switch, wherein there is provided:

a core having an intermediate leg and at least a pair of external legs arranged at equal intervals from the intermediate leg;

a first printed coil provided on a first substrate which has an intermediate hole and a pair of external holes respectively inserted in the intermediate leg and the pair of external legs of the core, the first printed coil being wound around the intermediate hole; and a second printed coil provided on a second substrate which has an intermediate hole and a pair of external holes respectively inserted in the intermediate leg and the pair of external legs of the core, the second printed coil including a pair of external printed coils which are connected in series and are respectively wound around the pair of the external holes and each having the same number of turns but wound in opposite directions;

wherein the pair of external printed coils of the second printed coil generate magnetic fields in opposite directions to each other in the intermediate leg such that the magnetic fields in the intermediate leg cancel each other and induce no induction voltage in the first printed coil, and induction voltages induced in the external printed coils of the second printed coil by magnetic flux generated by the first printed coil are substantially canceled, whereby the first printed coil and the second printed coil form separate inductors which are not magnetically coupled, further comprising a third printed coil provided on a third substrate which has an intermediate hole and a pair of external holes respectively inserted in the intermediate leg and the pair of external legs of the core, the third printed coil being wound around the intermediate hole, whereby the first printed coil is magnetically coupled with the third printed coil to form a first transformer;

and further wherein the transformer for power transmission comprises the first transformer.

2. The switching power supply apparatus of claim 1, further comprising a fourth printed coil provided on a fourth substrate which has an intermediate hole and a pair of external holes respectively inserted in the intermediate leg and the pair of external legs of the core, the fourth printed coil including a pair of external printed coils which are connected in series and are respectively wound around the pair of the external holes and each having the same number of turns but being wound in opposite directions, whereby the second printed coil is magnetically coupled with the fourth printed coil to form a second transformer, and wherein the choke coil comprises the second printed coil.

3. The switching power supply apparatus of claim 1, wherein the choke coil comprises the first printed coil.

4. The switching power supply apparatus of claim 1, wherein the choke coil comprises the second printed coil.

5. The switching power supply apparatus of claim 1, further comprising a fourth printed coil provided on a fourth substrate which has an intermediate hole and a pair of external holes respectively inserted in the intermediate leg and the pair of external legs of the core, the fourth printed coil including a pair of external printed coils which are connected in series and are respectively wound around the pair of the external holes and each having the same number of turns but being wound in opposite directions, whereby the second printed coil is magnetically coupled with the fourth printed coil to form a second transformer, and wherein the choke coil comprises the first printed coil.

6. A switching power supply apparatus comprising a transformer for power transmission having a primary coil and a secondary coil, a main switch to control the current flowing from an input power supply into the primary coil, a rectifying and smoothing circuit which includes a choke coil and rectifies and smoothes an output of the secondary coil of the transformer for power transmission, and a control circuit to control the action of the main switch, wherein there is provided:

a core having an intermediate leg and at least a pair of external legs arranged at equal intervals from the intermediate leg;

a first printed coil provided on a first substrate which has an intermediate hole and a pair of external holes respectively inserted in the intermediate leg and the pair of external legs of the core, the first printed coil being wound around the intermediate hole; and a second printed coil provided on a second substrate which has an intermediate hole and a pair of external holes respectively inserted in the intermediate leg and the pair of external legs of the core, the second printed coil including a pair of external printed coils which are connected in series and are respectively wound around the pair of the external holes and each having the same number of turns but wound in opposite directions;

wherein the pair of external printed coils of the second printed coil generate magnetic fields in opposite directions to each other in the intermediate leg such that the magnetic fields in the intermediate leg cancel each other and induce no induction voltage in the first printed coil, and induction voltages induced in the external printed coils of the second printed coil by magnetic flux generated by the first printed coil are substantially canceled, whereby the first printed coil and the second printed coil form separate inductors which are not magnetically coupled, further comprising a fourth printed coil provided on a fourth substrate which has an intermediate hole and a pair of external holes respectively inserted in the intermediate leg and the pair of external legs of the core, the fourth printed coil including a pair of external printed coils which are connected in series and are respectively wound around the pair of the external holes and each having the same number of turns but being wound in opposite directions, whereby the second printed coil is magnetically coupled with the fourth printed coil to form a second transformer, and further wherein the transformer for power transmission comprises the second transformer.

7. The switching power supply apparatus of claim 6, further comprising a third printed coil provided on a third substrate which has an intermediate hole and a pair of external holes respectively inserted in the intermediate leg and the pair of external legs of the core, the third printed coil being wound around the intermediate hole, whereby the first printed coil is magnetically coupled with the third printed coil to form a first transformer, and wherein the choke coil comprises the first printed coil.

8. The switching power supply apparatus of claim 6, further comprising a third printed coil provided on a third substrate which has an intermediate hole and a pair of external holes respectively inserted in the intermediate leg and the pair of external legs of the core, the third printed coil being wound around the intermediate hole, whereby the first printed coil is magnetically coupled with the third printed coil to form a first transformer, and wherein the choke coil comprises the second printed coil.

9. The switching power supply apparatus of claim 6, wherein the choke coil comprises the first printed coil.

10. The switching power supply apparatus of claim 6, herein the choke coil comprises the second printed coil.

11. A switching power supply apparatus including a transformer for power transmission having a primary coil and a secondary coil, a main switch to control the current flowing from an input power supply into the primary coil, a rectifying and smoothing circuit which includes a choke coil and rectifies and smoothes the output of the secondary coil of the transformer for power transmission and a current transformer to detect the current flowing in the main switch and to output it to the control circuit, wherein there is provided:

a core having an intermediate leg and at least a pair of external legs arranged at equal intervals from the intermediate leg;

a first printed coil provided on a first substrate which has an intermediate hole and a pair of external holes respectively inserted in the intermediate leg and the pair of external legs of the core, the first printed coil being wound around the intermediate hole; and a second printed coil provided on a second substrate which has an intermediate hole and a pair of external holes respectively inserted in the intermediate leg and the pair of external legs of the core, the second printed coil including a pair of external printed coils which are connected in series and are respectively wound around the pair of the external holes and each having the same number of turns but wound in opposite directions, wherein the pair of external printed coils of the second printed coil generate magnetic fields in opposite directions to each other in the intermediate leg such that the magnetic fields in the intermediate leg cancel each other and induce no induction voltage in the first printed coil, and induction voltages induced in the external printed coils of the second printed coil by magnetic flux generated by the first printed coil are substantially canceled, whereby the first printed coil and the second printed coil form separate inductors which are not magnetically coupled, further comprising a third printed coil provided on a third substrate which has an intermediate hole and a pair of external holes respectively inserted in the intermediate leg and the pair of external legs of the core, the third printed coil being wound around the intermediate hole, whereby the first printed coil is magnetically coupled with the third printed coil to form a first transformer, wherein the transformer for power transmission comprises the first transformer.

12. A switching power supply apparatus including a transformer for power transmission having a primary coil and a secondary coil, a main switch to control the current flowing from an input power supply into the primary coil, a rectifying and smoothing circuit which includes a choke coil and rectifies and smoothes the output of the secondary coil of the transformer for power transmission and a current transformer to detect the current flowing in the main switch and to output it to the control circuit, wherein there is provided:

a core having an intermediate leg and at least a pair of external legs arranged at equal intervals from the intermediate leg;

a first printed coil provided on a first substrate which has an intermediate hole and a pair of external holes respectively inserted in the intermediate leg and the pair of external legs of the core, the first printed coil being wound around the intermediate hole; and a second printed coil provided on a second substrate which has an intermediate hole and a pair of external holes respectively inserted in the intermediate leg and the pair of external legs of the core, the second printed coil including a pair of external printed coils which are connected in series and are respectively wound around the pair of the external holes and each having the same number of turns but wound in opposite directions, wherein the pair of external printed coils of the second printed coil generate magnetic fields in opposite directions to each other in the intermediate leg such that the magnetic fields in the intermediate leg cancel each other and induce no induction voltage in the first printed coil, and induction voltages induced in the external printed coils of the second printed coil by magnetic flux generated by the first printed coil are substantially canceled, whereby the first printed coil and the second printed coil form separate inductors which are not magnetically coupled, further comprising a third printed coil provided on a third substrate which has an intermediate hole and a pair of external holes respectively inserted in the intermediate leg and the pair of external legs of the core, the third printed coil being wound around the intermediate hole, whereby the first printed coil is magnetically coupled with the third printed coil to form a first transformer, wherein the current transformer comprises the first transformer.

13. A switching power supply apparatus including a transformer for power transmission having a primary coil and a secondary coil, a main switch to control the current flowing from an input power supply into the primary coil, a rectifying and smoothing circuit which includes a choke coil and rectifies and smoothes the output of the secondary coil of the transformer for power transmission and a current transformer to detect the current flowing in the main switch and to output it to the control circuit, wherein there is provided:

a core having an intermediate leg and at least a pair of external legs arranged at equal intervals from the intermediate leg;

a first printed coil provided on a first substrate which has an intermediate hole and a pair of external holes respectively inserted in the intermediate leg and the pair of external legs of the core, the first printed coil being wound around the intermediate hole; and a second printed coil provided on a second substrate which has an intermediate hole and a pair of external holes respectively inserted in the intermediate leg and the pair of external legs of the core, the second printed coil including a pair of external printed coils which are connected in series and are respectively wound around the pair of the external holes and each having the same number of turns but wound in opposite directions, wherein the pair of external printed coils of the second printed coil generate magnetic fields in opposite directions to each other in the intermediate leg such that the magnetic fields in the intermediate leg cancel each other and induce no induction voltage in the first printed coil, and induction voltages induced in the external printed coils of the second printed coil by magnetic flux generated by the first printed coil are substantially canceled, whereby the first printed coil and the second printed coil form separate inductors which are not magnetically coupled, further comprising a third printed coil provided on a third substrate which has an intermediate hole and a pair of external holes respectively inserted in the intermediate leg and the pair of external legs of the core, the third printed coil being wound around the intermediate hole, whereby the first printed coil is magnetically coupled with the third printed coil to form a first transformer, further comprising a fourth printed coil provided on a fourth substrate which has an intermediate hole and a pair of external holes respectively inserted in the intermediate leg and the pair of external legs of the core, the fourth printed coil including a pair of external printed coils which are connected in series and are respectively wound around the pair of the external holes and each having the same number of turns but having wound in the opposite directions, whereby the second printed coil is magnetically coupled with the fourth printed coil to form a second transformer, wherein the current transformer comprises the second transformer.

14. A switching power supply apparatus including a transformer for power transmission having a primary coil and a secondary coil, a main switch to control the current flowing from an input power supply into the primary coil, a rectifying and smoothing circuit which includes a choke coil and rectifies and smoothes the output of the secondary coil of the transformer for power transmission and a current transformer to detect the current flowing in the main switch and to output it to the control circuit, wherein there is provided:

a core having an intermediate leg and at least a pair of external legs arranged at equal intervals from the intermediate leg;

a first printed coil provided on a first substrate which has an intermediate hole and a pair of external holes respectively inserted in the intermediate leg and the pair of external legs of the core, the first printed coil being wound around the intermediate hole; and a second printed coil provided on a second substrate which has an intermediate hole and a pair of external holes respectively inserted in the intermediate leg and the pair of external legs of the core, the second printed coil including a pair of external printed coils which are connected in series and are respectively wound around the pair of the external holes and each having the same number of turns but wound in opposite directions, wherein the pair of external printed coils of the second printed coil generate magnetic fields in opposite directions to each other in the intermediate leg such that the magnetic fields in the intermediate leg cancel each other and induce no induction voltage in the first printed coil, and induction voltages induced in the external printed coils of the second printed coil by magnetic flux generated by the first printed coil are substantially canceled, whereby the first printed coil and the second printed coil form separate inductors which are not magnetically coupled, further comprising a third printed coil provided on a third substrate which has an intermediate hole and a pair of external holes respectively inserted in the intermediate leg and the pair of external legs of the core, the third printed coil being wound around the intermediate hole, whereby the first printed coil is magnetically coupled with the third printed coil to form a first transformer, further comprising a fourth printed coil provided on a fourth substrate which has an intermediate hole and a pair of external holes respectively inserted in the intermediate leg and the pair of external legs of the core, the fourth printed coil including a pair of external printed coils which are connected in series and are respectively wound around the pair of the external holes and each having the same number of turns but having wound in the opposite directions, whereby the second printed coil is magnetically coupled with the fourth printed coil to form a second transformer, wherein the transformer for power transmission comprises the second transformer.

15. A switching power supply apparatus including a transformer for power transmission having a primary coil and a secondary coil, a main switch to control the current flowing from an input power supply into the primary coil, a rectifying and smoothing circuit which includes a choke coil and has a rectifier to rectify and smooth the output of the secondary coil of the transformer for power transmission, a control circuit to control the action of the main switch, a drive transformer to transmit the drive signal from a control circuit and drive one of a high-side switch, a synchronous commutator and a secondary side switch, wherein there is provided:

a core having an intermediate leg and at least a pair of external legs arranged at equal intervals from the intermediate leg;

a first printed coil provided on a first substrate which has an intermediate hole and a pair of external holes respectively inserted in the intermediate leg and the pair of external legs of the core, the first printed coil being wound around the intermediate hole; and a second printed coil provided on a second substrate which has an intermediate hole and a pair of external holes respectively inserted in the intermediate leg and the pair of external legs of the core, the second printed coil including a pair of external printed coils which are connected in series and are respectively wound around the pair of the external holes and each having the same number of turns but wound in opposite directions, wherein the pair of external printed coils of the second printed coil generate magnetic fields in opposite directions to each other in the intermediate leg such that the magnetic fields in the intermediate leg cancel each other and induce no induction voltage in the first printed coil, and induction voltages induced in the external printed coils of the second printed coil by magnetic flux generated by the first printed coil are substantially canceled, whereby the first printed coil and the second printed coil form separate inductors which are not magnetically coupled, further comprising a third printed coil provided on a third substrate which has an intermediate hole and a pair of external holes respectively inserted in the intermediate leg and the pair of external legs of the core, the third printed coil being wound around the intermediate hole, whereby the first printed coil is magnetically coupled with the third printed coil to form a first transformer, wherein the transformer for power transmission comprises the first transformer.

16. A switching power supply apparatus including a transformer for power transmission having a primary coil and a secondary coil, a main switch to control the current flowing from an input power supply into the primary coil, a rectifying and smoothing circuit which includes a choke coil and has a rectifier to rectify and smooth the output of the secondary coil of the transformer for power transmission, a control circuit to control the action of the main switch, a drive transformer to transmit the drive signal from a control circuit and drive one of a high-side switch, a synchronous commutator and a secondary side switch, wherein there is provided:

a core having an intermediate leg and at least a pair of external legs arranged at equal intervals from the intermediate leg;

a first printed coil provided on a first substrate which has an intermediate hole and a pair of external holes respectively inserted in the intermediate leg and the pair of external legs of the core, the first printed coil being wound around the intermediate hole; and a second printed coil provided on a second substrate which has an intermediate hole and a pair of external holes respectively inserted in the intermediate leg and the pair of external legs of the core, the second printed coil including a pair of external printed coils which are connected in series and are respectively wound around the pair of the external holes and each having the same number of turns but wound in opposite directions, wherein the pair of external printed coils of the second printed coil generate magnetic fields in opposite directions to each other in the intermediate leg such that the magnetic fields in the intermediate leg cancel each other and induce no induction voltage in the first printed coil, and induction voltages induced in the external printed coils of the second printed coil by magnetic flux generated by the first printed coil are substantially canceled, whereby the first printed coil and the second printed coil form separate inductors which are not magnetically coupled, further comprising a third printed coil provided on a third substrate which has an intermediate hole and a pair of external holes respectively inserted in the intermediate leg and the pair of external legs of the core, the third printed coil being wound around the intermediate hole, whereby the first printed coil is magnetically coupled with the third printed coil to form a first transformer, wherein the drive transformer comprises the first transformer.

17. A switching power supply apparatus including a transformer for power transmission having a primary coil and a secondary coil, a main switch to control the current flowing from an input power supply into the primary coil, a rectifying and smoothing circuit which includes a choke coil and has a rectifier to rectify and smooth the output of the secondary coil of the transformer for power transmission, a control circuit to control the action of the main switch, a drive transformer to transmit the drive signal from a control circuit and drive one of a high-side switch, a synchronous commutator and a secondary side switch, wherein there is provided:

a core having an intermediate leg and at least a pair of external legs arranged at equal intervals from the intermediate leg;

a first printed coil provided on a first substrate which has an intermediate hole and a pair of external holes respectively inserted in the intermediate leg and the pair of external legs of the core, the first printed coil being wound around the intermediate hole; and a second printed coil provided on a second substrate which has an intermediate hole and a pair of external holes respectively inserted in the intermediate leg and the pair of external legs of the core, the second printed coil including a pair of external printed coils which are connected in series and are respectively wound around the pair of the external holes and each having the same number of turns but wound in opposite directions, wherein the pair of external printed coils of the second printed coil generate magnetic fields in opposite directions to each other in the intermediate leg such that the magnetic fields in the intermediate leg cancel each other and induce no induction voltage in the first printed coil, and induction voltages induced in the external printed coils of the second printed coil by magnetic flux generated by the first printed coil are substantially canceled, whereby the first printed coil and the second printed coil form separate inductors which are not magnetically coupled, further comprising a fourth printed coil provided on a fourth substrate which has an intermediate hole and a pair of external holes respectively inserted in the intermediate leg and the pair of external legs of the core, the fourth printed coil including a pair of external printed coils which are connected in series and are respectively wound around the pair of the external holes and each having the same number of turns but having wound in the opposite directions, whereby the second printed coil is magnetically coupled with the fourth printed coil to form a second transformer;

wherein the transformer for power transmission comprises the second transformer.

18. A switching power supply apparatus including a transformer for power transmission having a primary coil and a secondary coil, a main switch to control the current flowing from an input power supply into the primary coil, a rectifying and smoothing circuit which includes a choke coil and has a rectifier to rectify and smooth the output of the secondary coil of the transformer for power transmission, a control circuit to control the action of the main switch, a drive transformer to transmit the drive signal from a control circuit and drive one of a high-side switch, a synchronous commutator and a secondary side switch, wherein there is provided:

a core having an intermediate leg and at least a pair of external legs arranged at equal intervals from the intermediate leg;

a first printed coil provided on a first substrate which has an intermediate hole and a pair of external holes respectively inserted in the intermediate leg and the pair of external legs of the core, the first printed coil being wound around the intermediate hole; and a second printed coil provided on a second substrate which has an intermediate hole and a pair of external holes respectively inserted in the intermediate leg and the pair of external legs of the core, the second printed coil including a pair of external printed coils which are connected in series and are respectively wound around the pair of the external holes and each having the same number of turns but wound in opposite directions, wherein the pair of external printed coils of the second printed coil generate magnetic fields in opposite directions to each other in the intermediate leg such that the magnetic fields in the intermediate leg cancel each other and induce no induction voltage in the first printed coil, and induction voltages induced in the external printed coils of the second printed coil by magnetic flux generated by the first printed coil are substantially canceled, whereby the first printed coil and the second printed coil form separate inductors which are not magnetically coupled, further comprising a fourth printed coil provided on a fourth substrate which has an intermediate hole and a pair of external holes respectively inserted in the intermediate leg and the pair of external legs of the core, the fourth printed coil including a pair of external printed coils which are connected in series and are respectively wound around the pair of the external holes and each having the same number of turns but having wound in the opposite directions, whereby the second printed coil is magnetically coupled with the fourth printed coil to form a second transformer;

wherein the drive transformer comprises the second transformer.

* * * * *